United States Patent [19]
Hayakawa et al.

[11] Patent Number: 5,347,170
[45] Date of Patent: Sep. 13, 1994

[54] SEMICONDUCTOR INTEGRATED CIRCUIT HAVING A VOLTAGE STEPDOWN MECHANISM

[75] Inventors: Shigeyuki Hayakawa, Yokohama; Leiichi Yanagisawa, Kawasaki, both of Japan

[73] Assignee: Kabushiki Kaisha Toshiba, Kawasaki, Japan

[21] Appl. No.: 943,538

[22] Filed: Sep. 11, 1992

Related U.S. Application Data

[63] Continuation of Ser. No. 651,440, Feb. 7, 1991, Pat. No. 5,184,031.

[30] Foreign Application Priority Data

Feb. 28, 1990 [JP] Japan .................................. 2-27086

[51] Int. Cl.$^5$ .............................................. H03K 3/01
[52] U.S. Cl. .................. 307/296.1; 307/296.3; 307/296.5; 307/296.6
[58] Field of Search ............ 307/296.1, 296.3, 296.5, 307/296.6

[56] References Cited

U.S. PATENT DOCUMENTS 4,961,008 10/1990 Fujiwara et al. ................ 307/296.3
5,184,031 2/1993 Hayakawa ....................... 307/296.3

Primary Examiner—Robert J. Pascal
Assistant Examiner—Reginald A. Ratliff
Attorney, Agent, or Firm—Finnegan, Henderson, Farabow, Garrett & Dunner

[57] ABSTRACT

The external power supply voltage applied to an external power supply terminal is supplied to an internal stepdown circuit and a switch circuit. The value of the external power supply voltage is detected by an external voltage detecting circuit, and if the value is greater than a predetermined value, the internal stepdown circuit operates, the external power supply voltage is stepped down by the internal stepdown circuit and supplied to an internal circuit as an internal power supply voltage. Alternatively, if the value of the external power supply voltage is smaller than the predetermined value, the internal stepdown circuit does not operate, and instead the switch circuit operates and the external power supply voltage is supplied via the switch circuit to the internal circuit as the internal power supply voltage.

12 Claims, 11 Drawing Sheets

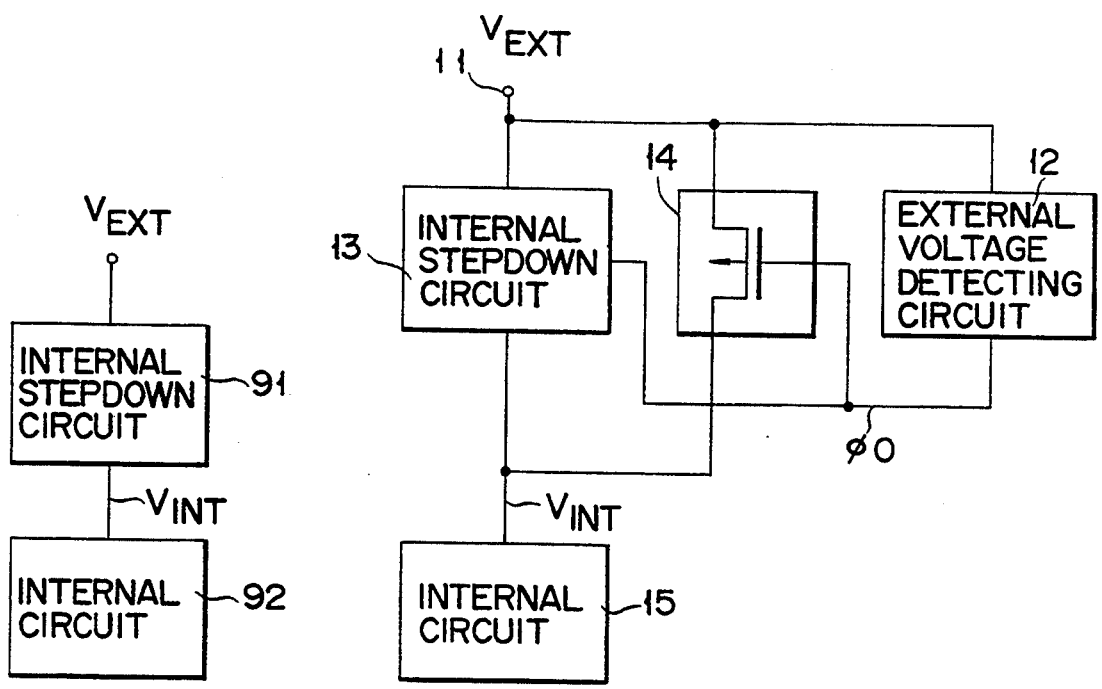
F I G. 1
(PRIOR ART)
F I G. 2
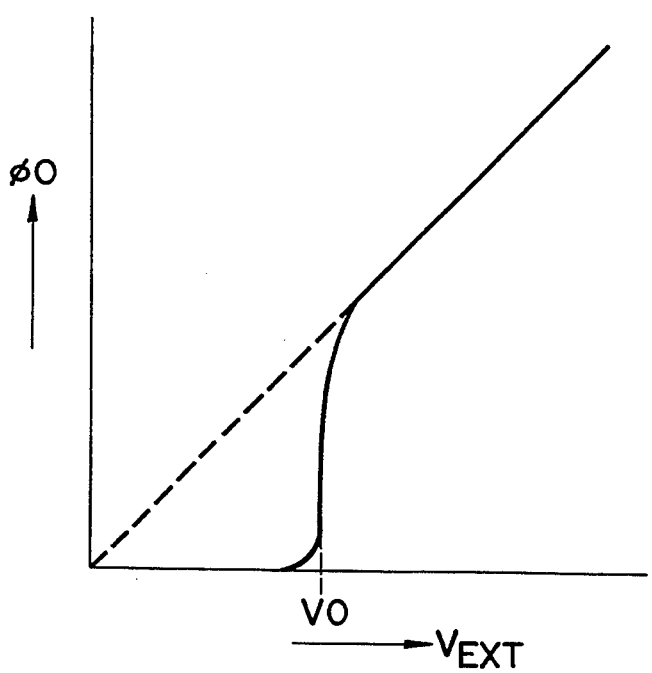
F I G. 3

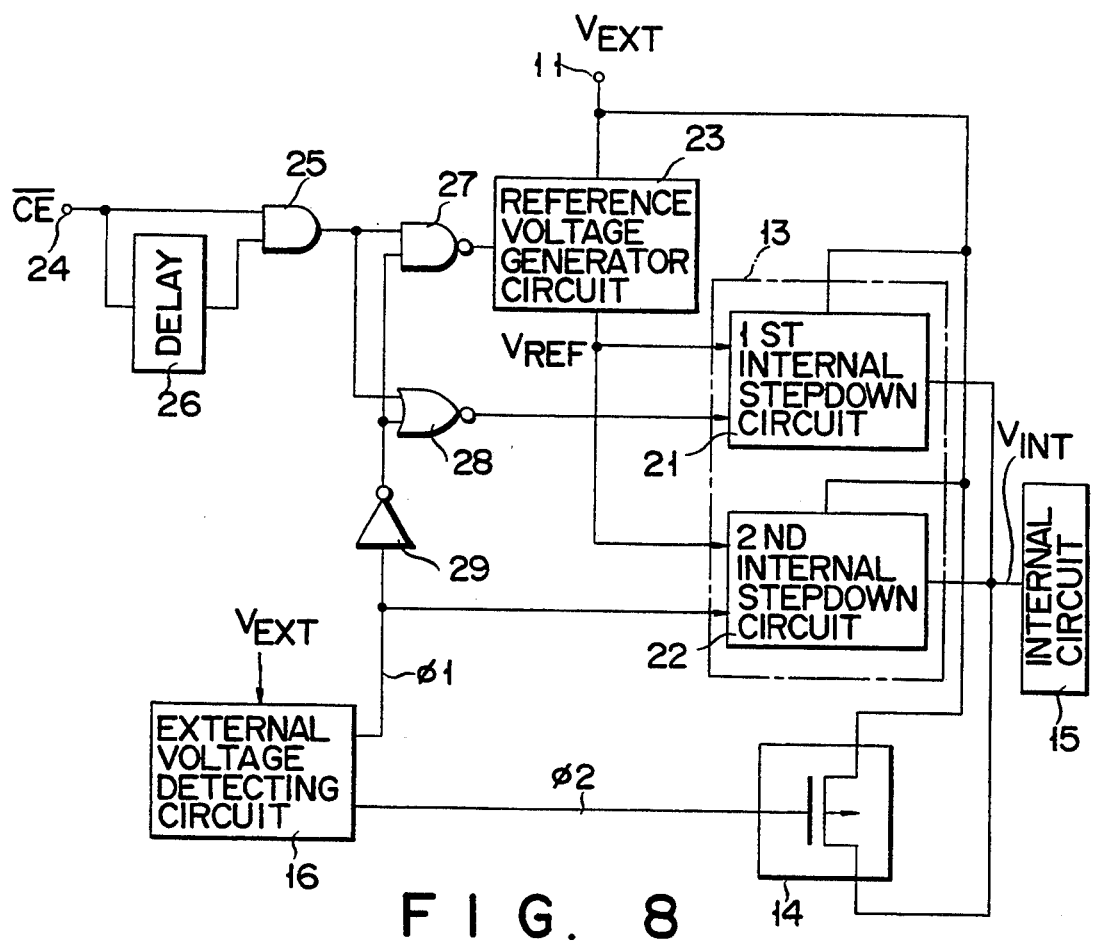
F I G. 8
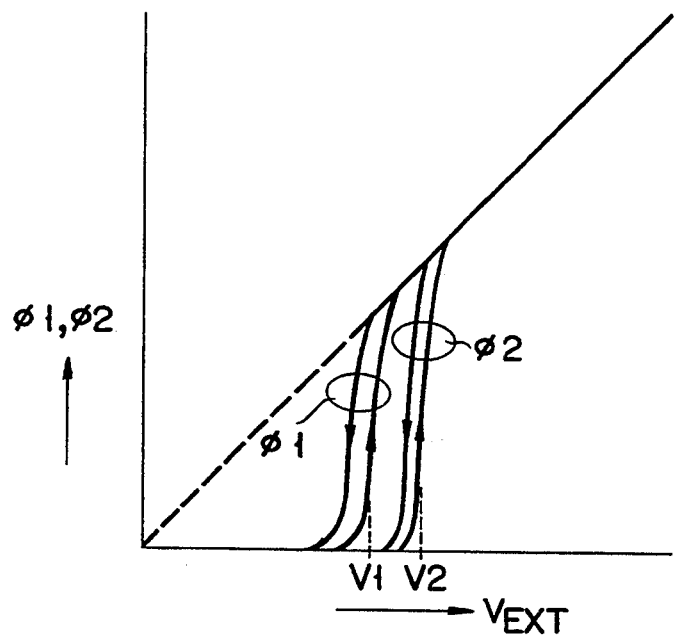
F I G. 9

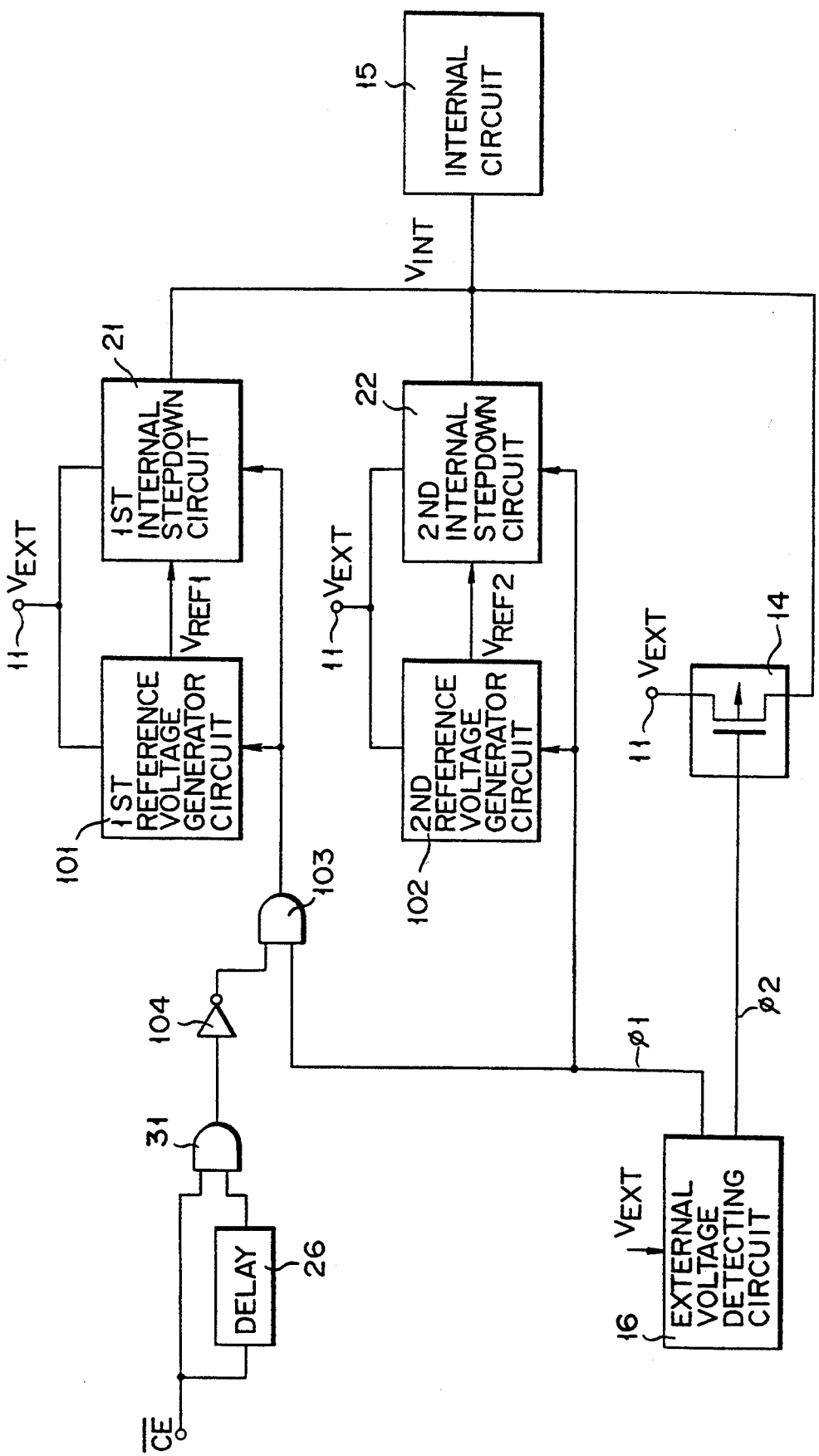
F I G. 16

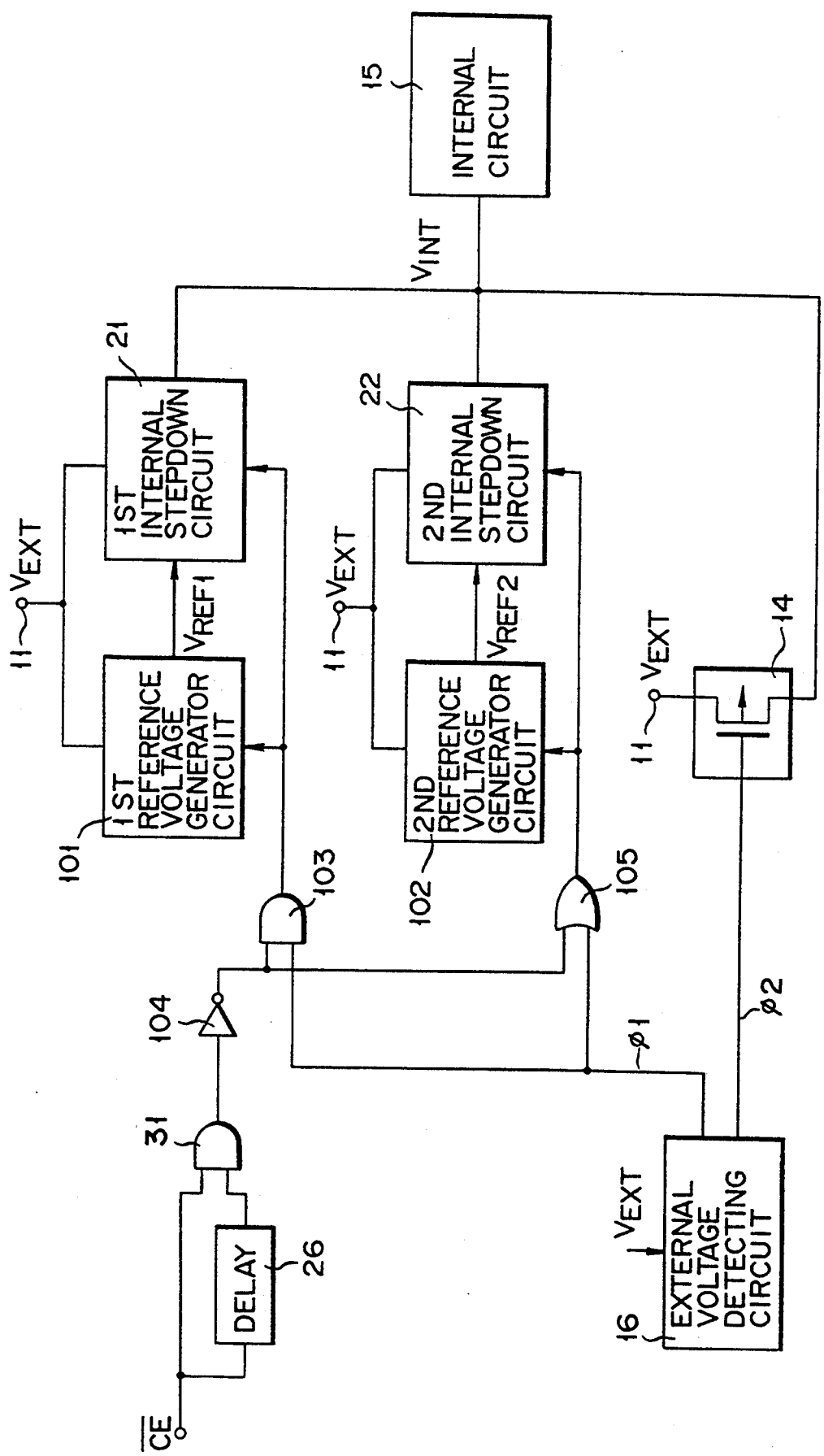
F I G. 18

SEMICONDUCTOR INTEGRATED CIRCUIT HAVING A VOLTAGE STEPDOWN MECHANISM

This is a continuation of application Ser. No. 07/651,440, filed Feb. 7, 1991, now U.S. Pat. No. 5,184,031.

BACKGROUND OF THE INVENTION

1. Field of the Invention

This invention is related to a semiconductor integrated circuit wherein the power supply voltage supplied from the outside is stepped down internally of the integrated circuit for use as the internal power supply voltage.

2. Description of the Related Art

In a semiconductor integrated circuit in which a large number of elements are integrated (hereinafter referred to as IC) such as a static semiconductor memory (hereinafter referred to as SRAM), the size of transistors is increasingly reduced year each year. As a result, if the standard power supply voltage of 5 V which has traditionally been used is supplied to an IC, a reliability problem such as destruction of the internal micronized transistors occurs.

Conventionally, in a highly integrated IC in which such a problem can occur, internal stepdown circuit 91 is provided, as shown in FIG. 1, and after a standard power supply voltage $V_{EXT}$ of 5 V supplied from the outside is stepped down in the internal stepdown circuit 91 to an internal power supply voltage $V_{INT}$ of the order of 3 V, for instance, it is provided to internal circuit 92 including the micronized transistors.

Incidentally, no problem occurs if the conventional IC is always operated by the standard power supply voltage of 5 V obtained in a power supply unit. However, if the IC is a SRAM and a so-called battery backup operation causing data to be held by a battery is performed, a problem occurs. That is, up to present, a current is consumed in internal stepdown circuit 91 not only in the operation by the power supply voltage obtained in the power supply unit, but also in the backup operation by a battery. For this, the consumption of the battery becomes extreme and the battery backup operation for a long period of time is not available.

SUMMARY OF THE INVENTION

This invention was made in consideration of the situations as described above, and its object is to provide, in the semiconductor integrated circuit in which the external power supply voltage is stepped down and used as the internal power supply voltage, a semiconductor integrated circuit wherein a long-term battery backup operation is possible.

In accordance with preferred embodiments of this invention, a semiconductor integrated circuit is provided which comprises an internal circuit having a predetermined function, a power supply terminal which is externally supplied with a power supply voltage, voltage detecting means for detecting the voltage value of the power supply terminal voltage stepdown means the activation of which is controlled in response to the detection result of the voltage detecting means, and when activated, reduces the external power supply voltage supplied to the power supply terminal and provides it to the internal circuit as the internal power supply voltage, and control means connected between the power supply terminal and the internal circuit, and responsive to the detection result of the voltage detecting means for controlling the supply of the voltage applied to the power supply terminal to the internal circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

FIG. 1 is a block diagram of the conventional semiconductor integrated circuit;

FIG. 2 is a block diagram showing the circuit construction of the first embodiment of this invention;

FIG. 3 is a signal waveform diagram for explaining the first embodiment;

FIG. 8 is a block diagram showing the circuit construction of the fourth embodiment of this invention;

FIG. 9 is a signal waveform for explaining the fourth embodiment;

FIG. 16 is a block diagram showing the circuit construction of the seventh embodiment of this invention;

FIG. 18 is a block diagram showing the circuit construction of the ninth embodiment of this invention.

DETAILED DESCRIPTION OF THE PREFERRED EMBODIMENTS

Figure 4:
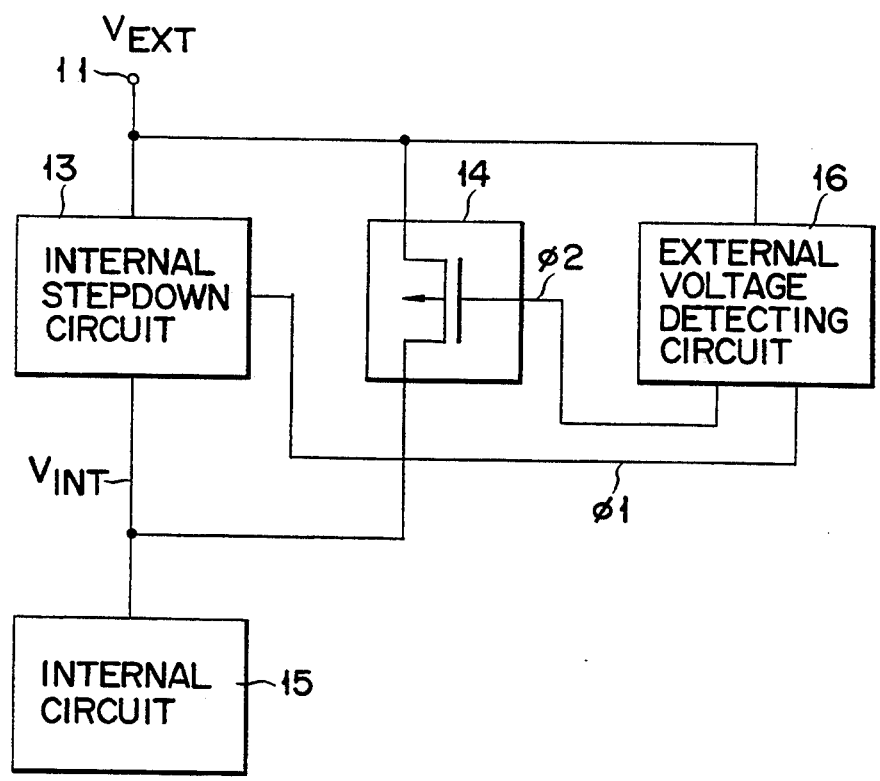
FIG. 4 is a block diagram showing the circuit construction of the second embodiment of this invention.

The embodiments of the invention will now be described with reference to the drawings.

FIG. 2 is a block diagram showing the circuit construction of the first embodiment of this invention wherein this invention is incorporated in a SRAM. In the figure, 11 is an external power supply terminal to which power supply voltage $V_{EXT}$ is supplied from the outside of the integrated circuit. When this integrated circuit performs a normal operation, namely a writing or reading operation of data, the standard voltage of 5 V obtained in the power supply circuit is supplied to the terminal 11 as the external power supply voltage $V_{EXT}$. On the other hand, during the standby operation, a voltage of the order of 3 V is supplied to the terminal 11 from a battery, for instance.

The external power supply voltage $V_{EXT}$ supplied to the terminal 11 is provided to external voltage detecting circuit 12, internal stepdown circuit 13 and switch circuit 14, respectively.

The external voltage detecting circuit 12 detects the value of the external power supply voltage $V_{EXT}$, and generates a control signal $\phi 0$ which is a "L" level if the detected value is lower than a predetermined voltage V0 and a "H" level if larger. V0 is a value between 0 V and 5 V. The control signal $\phi 0$ generated in the external voltage detecting circuit 12 is supplied in parallel to the internal stepdown circuit 13 and the switch circuit 14.

The internal stepdown circuit 13 is activated depending on the level of the control signal $\phi 0$, and reduces the external power supply voltage $V_{EXT}$ of 5 V and generates an internal power supply voltage $V_{INT}$ of the order of 3 V, for instance, while it is activated. In addition, the switch circuit 14 consists of, for instance, a P-channel MOSFET as shown, the conduction of which is controlled depending on the level of the control signal $\phi 0$ to pass or cut off the external power supply voltage $V_{EXT}$.

The outputs of the internal stepdown circuit 13 and switch circuit 14 are fed as a power supply voltage to internal circuit 15 including a memory cell having a data memory function, for instance.

The operation of the circuit as constructed above is now described using the signal waveform diagram of FIG. 3. When this integrated circuit performs a normal operation, that is, a data writing or reading operation, a voltage of 5 V from a power supply unit is applied to terminal 11 as the external power supply voltage $V_{EXT}$. Since the value of the voltage $V_{EXT}$ is larger than the detected value V0 in external voltage detecting circuit 12, the control signal $\phi 0$ becomes the "" level. Internal stepdown circuit 13 is activated by the control signal $\phi 0 = H$, switch circuit 14 becomes a non-conductive state $\phi 0 = H$, and the external power supply voltage $V_{EXT}$ is stepped down in internal stepdown circuit 13, whose output voltage of the order of 3 V is provided to internal circuit 15 as the internal power supply voltage $V_{INT}$.

On the other hand, when the integrated circuit performs the standby operation, a voltage of the order of 3 V, for instance, is applied from a battery to terminal 11 as the external power supply voltage $V_{EXT}$. Since the value of the voltage $V_{EXT}$ at this time is smaller than the detected value V0 in external voltage detecting circuit 12, the control signal $\phi 0$ becomes the "L" level. Internal stepdown circuit 13 is made inactive by the control signal $\phi 0 = L$, and switch circuit 14 becomes conducting. For this, the voltage from the battery which was supplied to terminal 11 is supplied, as it is, through switch circuit 14 to internal circuit 15 as the internal power supply voltage $V_{INT}$.

Thus, according to the above embodiment, since the operation of internal stepdown circuit 13 is stopped to save the consumption of the current during the backup operation by the battery, the battery consumption can be restricted and the battery backup operation for a long-period of time is enabled.

Next, the second embodiment of this invention is described according to FIG. 4. In this embodiment, a new external voltage detecting circuit 16 is provided as an alternate to the external voltage detecting circuit 12.

The new external voltage detecting circuit 16 detects the value of the external power supply voltage $V_{EXT}$, and generates a control signal $\phi 1$ which becomes an "L" level when the detected value is smaller than a predetermined voltage V1 and a "H" level when larger, and a control signal $\phi 2$ which becomes the "L" level when the detected value is smaller than V2 and the "H" level when larger. It is supposed that both V1 and V2 are values between 0 V and 5 V, and V1<V2. And one control signal $\phi 1$ generated in the external voltage detecting circuit 16 is supplied to the internal stepdown circuit 13, and the other control signal $\phi 2$ is provided to the switch circuit 14.

The internal stepdown circuit 13 is activated depending on the level of the control signal $\phi 1$, and steps down the external power supply voltage $V_{EXT}$ of 5 V to generate the internal power supply voltage $V_{INT}$ of the order of 3 V, for instance, while activate. Further, the switch circuit 14 consists of, for instance, a P-channel MOS transistor as in the case of FIG. 2, the conduction of which is controlled depending on the level of the control signal $\phi 2$ to pass or cut off the external power supply voltage $V_{EXT}$.

Figure 5:
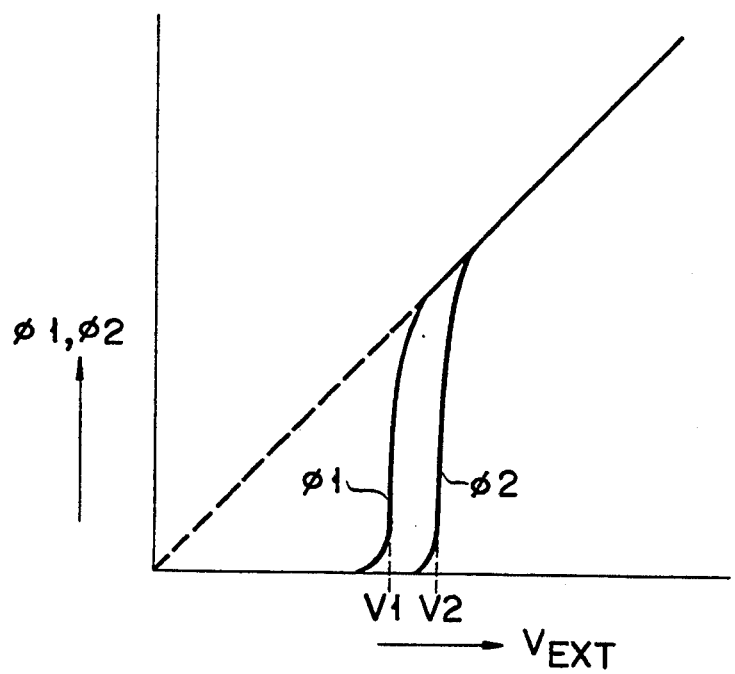
FIG. 5 is a signal waveform diagram for explaining the second embodiment.

The operation of the circuit constructed as above is now described using the waveform diagram of FIG. 5. When this integrated circuit performs the normal operation, the voltage of 5 V from the power supply circuit is supplied to terminal 11 as the external power supply voltage $V_{EXT}$. The value of the voltage $V_{EXT}$ at this time is larger than the respective two detected values V1 and V2 in the external voltage detecting circuit 16, and thus one and the other control signals $\phi 1$ and $\phi 2$ both become the "H" level. At this time, internal stepdown circuit 13 is activated by the control signal $\phi 1$ and switch circuit 14 becomes nonconducting, and consequently the external power supply voltage $V_{EXT}$ is stepped down in internal circuit 13, whose output voltage of the order of 3 V is supplied to internal circuit 15 as the internal power supply voltage $V_{INT}$.

On the other hand, when this integrated circuit performs the standby operation, the voltage from the battery of, for instance, 3 V is supplied to terminal 11 as the external power supply voltage $V_{EXT}$. The value of the voltage $V_{EXT}$ at this time is smaller than the respective two detected values V1 and V2, and thus one and the other control signals $\phi 1$ and $\phi 2$ both become the "L" level. Whereupon, internal stepdown circuit 13 is put in an inactive state by the control signal $\phi 1$ and switch circuit 14 becomes conductive. Accordingly, the voltage from the battery which was supplied to terminal 11 is provided, as it is, through switch circuit 14 to internal circuit 15 as the internal power supply voltage $V_{INT}$.

Thus, also in the above embodiment, during the backup operation by the battery, the operation of internal stepdown circuit 13 is halted to save the consumption of the current, so that the consumption of the battery can be limited, whereby a long-term battery backup operation is provided.

In addition, in the above embodiment, the two different detected values V1 and V2 are set in external voltage detecting circuit 16, thereby obtaining the following effect as well. If, in a memory such as a SRAM, the power supply voltage is not supplied even for an instant, inconvenience such as destruction of stored data will occur. If the operations of internal stepdown circuit 13 and switch circuit 14 are simultaneously controlled using one control signal $\phi 0$ generated in external voltage detecting circuit 12 as in the embodiment of FIG. 2, the supply of the power supply voltage to internal circuit 15 can temporarily be stopped. For this, in the embodiment circuit of FIG. 4, the two detected values V1 and V2 are set in external voltage detecting circuit 16 so that the levels of the two control signals $\phi 1$ and $\phi 2$ do not change at the same time as shown in FIG. 5. To specifically explain this, when the value of the external power supply voltage $V_{EXT}$ decreases to be slightly smaller than the detected value V2, the control signal $\phi 2$ becomes the "L" level, making switch circuit 14 conductive. At this time, since the value of the voltage $V_{EXT}$ is larger than the detected value V1, the control signal $\phi 1$ remains to be the previous "H" level. Accordingly, internal stepdown circuit 13 is operating at this time. And, if the external power supply voltage $V_{EXT}$ decreases to be smaller than the detected value V1, the control signal $\phi 1$ changes to the "L" level when internal stepdown circuit 13 becomes inactive for the first time. That is, since switch circuit 14 conducts before internal stepdown circuit 13 stops its operation, the power supply voltage can be prevented from being not supplied to internal circuit 15 even for an instant. Also in the event that the value of the external power supply voltage $V_{EXT}$ increases, switch circuit 14 becomes nonconducting after internal stepdown circuit 13 starts to operate, and thus the power supply voltage can be prevented from being not supplied to internal circuit 15 even for an instant.

Figure 6:
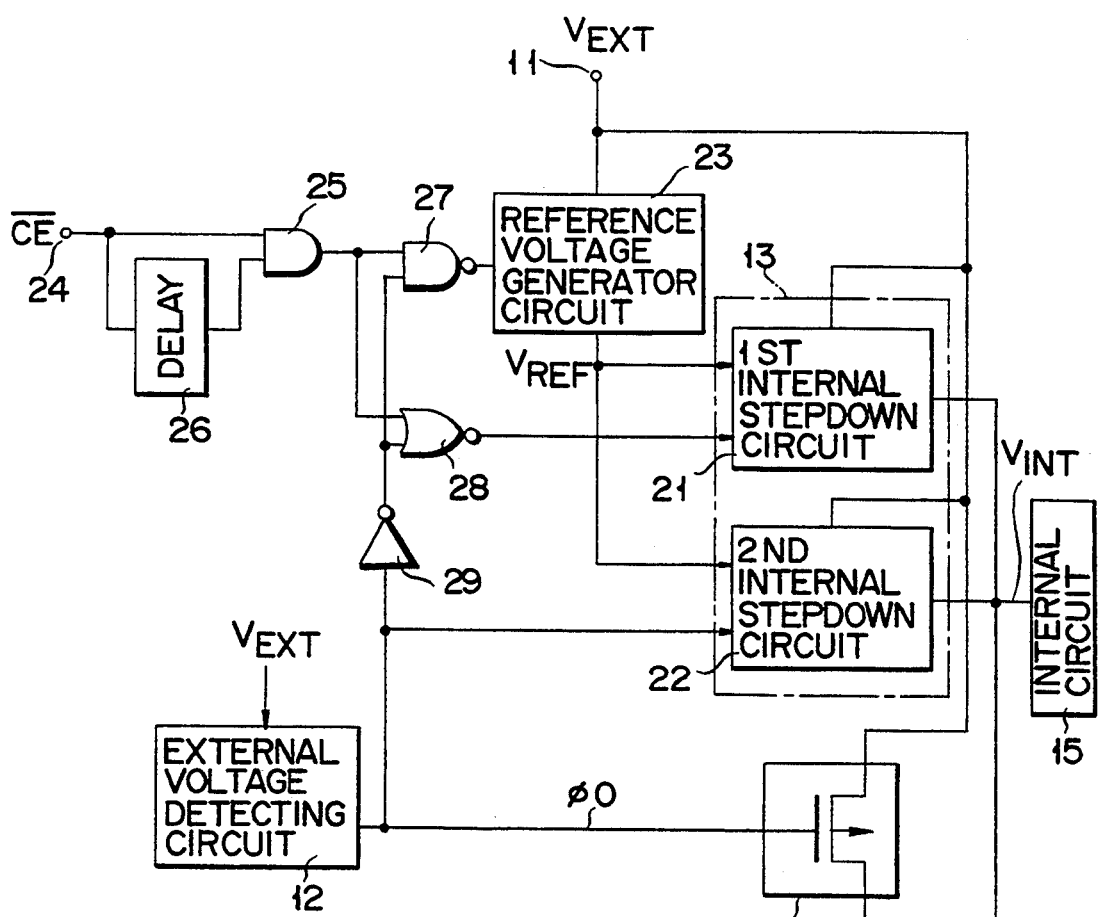
FIG. 6 is a block diagram showing the circuit construction of the third embodiment of this invention.

FIG. 6 is a block diagram showing the construction of the third embodiment of this invention. This embodiment circuit is adapted so that the operation of switch circuit 14 is controlled depending on the value of the power supply voltage $V_{EXT}$ supplied to the external power supply terminal 11, and that the operation of internal stepdown circuit 13 is controlled by the value of the power supply voltage $V_{EXT}$ and a chip selection signal (chip enable signal) $\overline{CE}$ which is supplied from the exterior of the integrated circuit. Incidentally, the same symbols are assigned to the portions corresponding to FIG. 2.

In the circuit of this embodiment, the internal stepdown circuit 13 is comprised of a first internal stepdown circuit 21 for the normal operation and a second internal stepdown circuit 22 for the standby operation. To both internal stepdown circuits 21 and 22, the power supply voltage $V_{EXT}$ supplied to external power supply terminal 11 is provided.

Further, to both internal stepdown circuits 21 and 22, a reference voltage $V_{REF}$ generated in reference voltage generator circuit 23 is supplied. The reference voltage generator circuit 23 generates a constant reference voltage $V_{REF}$ from external power supply voltage $V_{EXT}$ while being activated.

In addition, in the figure, 24 represents an external control terminal to which the chip selection signal $\overline{CE}$ is supplied from the outside of the integrated circuit. The chip selection signal $\overline{CE}$ supplied to the terminal 24 is inputted to one input terminal of AND gate 25 and to delay circuit 26. The delay circuit 26 delay the chip selection signal $\overline{CE}$ by a predetermined period of time. And, the output of the delay circuit 26 is inputted to the other input terminal of the AND gate 25. In turn, the output of the AND gate 25 is supplied to the respective one input terminals of NAND gate 27 NOR gate 28.

On the other hand, the control signal $\phi 0$ generated in external voltage detecting circuit 12 is directly supplied to switch circuit 14 and the second internal stepdown circuit 22, and simultaneously supplied to the respective other input terminals of the NAND gate 27 and NOR gate 28 through inverter 29.

The reference voltage generator circuit 23, first internal stepdown circuit 21 for the normal operation and second internal stepdown circuit 22 for the standby operation are activated on the basis of the output of the NAND gate 27, the output of the NOR gate 28 and the control signal $\phi 0$, respectively.

Incidentally, although both internal stepdown circuits 21 and 22 are provided with a similar circuit construction, the current consumption of the second internal stepdown circuit 22 for the standby operation is made less than that of the first internal stepdown circuit 21 for the normal operation by making the element sizes of the corresponding transistors within the circuits differ from each other.

Figure 7:
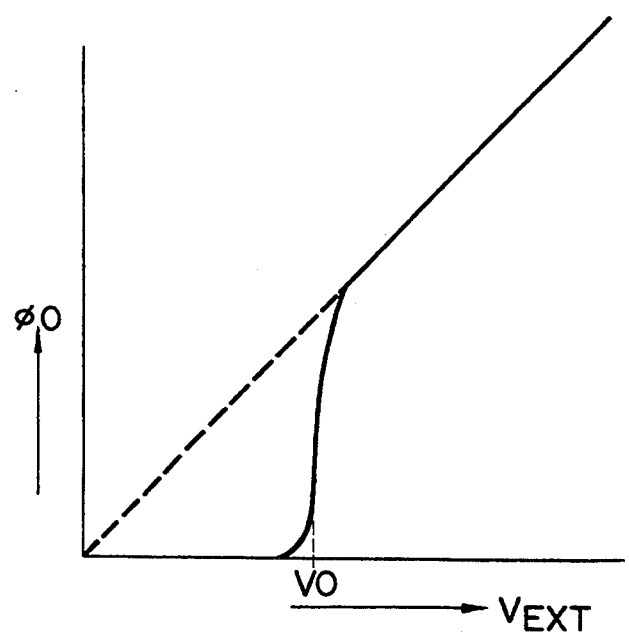
FIG. 7 is a signal waveform diagram for explaining the third embodiment.

Now, the operation of the circuit constructed as above is described using the signal waveform in FIG. 7. In the normal operation during which the voltage of 5 V from the power supply circuit is supplied to terminal 11 as the external power supply voltage $V_{EXT}$ and the chip selection signal $\overline{CE}$ is held at the "L" level, the value of the voltage $V_{EXT}$ is larger than the detected value V0, and thus the control signal $\phi 0$ generated in external voltage detecting circuit 12 becomes the "H" level. In consequence, switch circuit 14 becomes nonconducting. In addition, the second internal stepdown circuit 22 is activated by the control signal $\phi O$. Further, since the chip selection signal $\overline{CE}$ is held at the "L" level, the output of AND gate 25 also becomes the "L" level. Since the output of inverter 29 is in the "L" level, the respective outputs of NAND gate 27 and NOR gate 28 both become the "H" level. Accordingly, reference voltage generator circuit 23 and the first internal stepdown circuit 22 are both activated. And, the reference voltage $V_{REF}$ generated in the activated reference voltage generator circuit 23 is provided to the first and second internal stepdown circuits 21 and 22, whereby the external power supply voltage $V_{EXT}$ is stepped down in both internal stepdown circuits 21 and 22 on the basis of the reference voltage $V_{REF}$, and the respective reduced internal power supply voltages $V_{INT}$ are supplied to internal circuit 15. That is, with this condition, the external power supply voltage $V_{EXT}$ is stepped down concurrently by the first and second internal stepdown circuits 21 and 22, and the voltages $V_{INT}$ after being stepped down are supplied to internal circuit 15.

Then, if the chip selection signal $\overline{CE}$ is changed to the "H" level while the voltage of 5 V is supplied to terminal 11, the output of AND gate 25 becomes the "H" level after the delay time in delay circuit 26. At the time, the output of NAND gate 27 remains to be the "H" level because the output of inverter 29 remains to be the "L" level, but the output of NOR gate 28 reverses from the previous "H" level to the "L" level. Consequently, in the standby operation by the chip selection signal, only the second internal stepdown circuit 22 of the smaller current consumption in internal stepdown circuit 13 is activated, and the external power supply voltage $V_{EXT}$ is stepped down by the internal stepdown circuit 22 and the voltage $V_{INT}$ after the voltage reduction is supplied to internal circuit 15.

In addition, in the battery backup operation in which a voltage of, for instance, 3 V is supplied from a battery to terminal 11 as the external power supply voltage $V_{EXT}$, the value of the voltage $V_{EXT}$ is smaller than the detected value V0 in external voltage detecting circuit 12, and thus the control signal $\phi 0$ becomes the "L" level as in the case of the embodiment circuit of FIG. 2. And, the control signal $\phi 0$ makes both internal stepdown circuits 21 and 22 in internal stepdown circuit 13 inactive and reference voltage generator circuit 23 also becomes inactive, whereby a large reduction of the useless current consumption is accomplished.

In addition, in this case, switch circuit 14 is made conductive by the control signal $\phi 0$, and the voltage supplied from the battery to terminal 11 is directly provided to internal circuit 15 as the internal power supply voltage $V_{INT}$.

In the fourth embodiment circuit of this invention as shown in FIG. 8, as an alternate to external voltage detecting circuit 12 in the embodiment circuit of FIG. 6, a new external voltage detecting circuit 16 is provided which generates two control signals $\phi 1$ and $\phi 2$ as in the case of the embodiment of FIG. 4.

One control signal $\phi 1$ generated in the external voltage detecting circuit 17 is directly supplied to the second internal stepdown circuit 22, and simultaneously supplied to the respective other input terminals of the NAND gate 27 and NOR gate 28 through inverter 29. The other control signal $\phi 2$ is supplied to the switch circuit 14.

In the case of this embodiment, the respective two detected values V1 and V2 in external voltage detecting circuit 17 are provided with hysteresis characteristics as shown in FIG. 9, thereby for preventing a fault operation when a noise mixes into the external power supply voltage $V_{EXT}$. Incidentally, such hysteresis characteristics may also be provided to the embodiment circuit of FIG. 4.

The detailed constructions of the individual circuits in the embodiment circuits in FIGS. 6 and 8 are described below.

Figure 10:
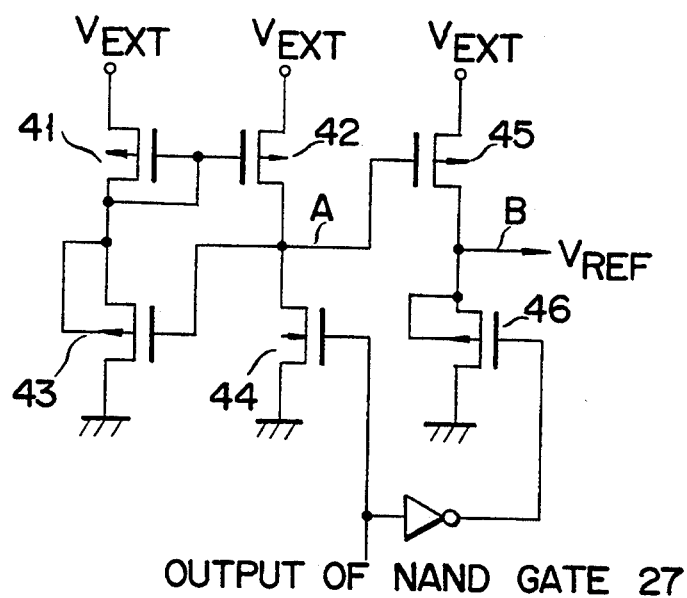
FIG. 10 is a circuit diagram showing the detailed construction of the reference voltage generator circuit in the embodiment circuits of FIGS. 6 and 8.

FIG. 10 is a detailed circuit diagram of reference voltage generator circuit 23 which generates the reference voltage $V_{REF}$. In this circuit, a fixed current generated in a current-mirror circuit consisting of P-channel MOSFET's 41 and 42 and a N-channel MOSFET 43 is made to flow into MOSFET 44, whereby a voltage obtained by subtracting the threshold voltages of the two P-channel MOSFET's from the external power supply voltage $V_{EXT}$ is provided at node A. In addition, by supplying the voltage at node A to a P-channel MOSFET 45 operating as a constant-current source, and controlling a P-channel MOSFET 46 operating as the load of the FET 45 with the inverted signal of the output of NAND gate 27, a reference voltage $V_{REF}$ substantially equivalent to the threshold voltages of two P-channel MOSFET's is obtained from node B which is the series junction of the two FET's 45 and 46.

Figure 11:
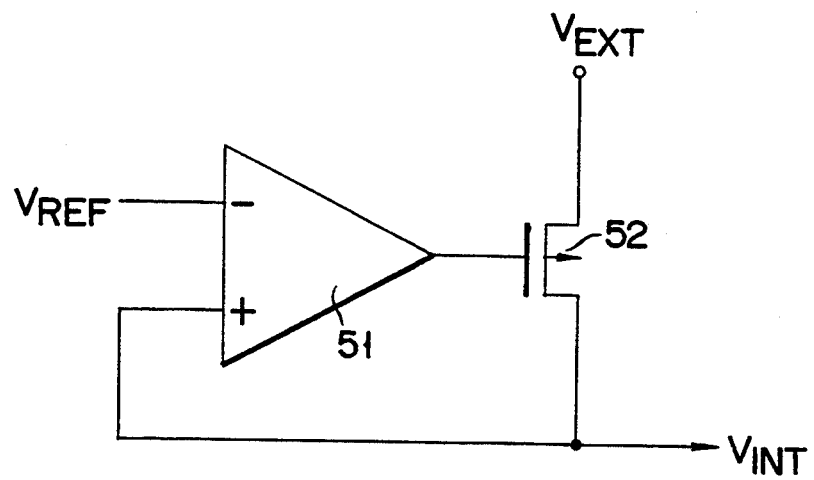
FIG. 11 is a circuit diagram showing the detailed construction of the internal stepdown circuit in the embodiment circuits of FIGS. 6 and 8.

FIG. 11 is a detailed circuit diagram of the first and second internal stepdown circuits 21 and 22. Both of these circuits are provided with a similar circuit construction as described above, which consists of a voltage comparator 51 for comparing the reference voltage $V_{REF}$ generated in the reference voltage generator circuit 23 with the internal power supply voltage $V_{INT}$, and a P-channel MOSFET 52 the conduction of which is controlled by the differential voltage outputted from the comparator 51.

In this circuit, the internal power supply voltage $V_{INT}$ and the reference voltage $V_{REF}$ are compared by voltage comparator 51, and if $V_{INT}$ becomes smaller than $V_{REF}$, then the output voltage of voltage comparator 51 decreases, the conduction resistance of FET 52 decreases, and $V_{INT}$ increases. Conversely, if $V_{INT}$ becomes larger than $V_{REF}$, then the output voltage of voltage comparator 51 increases, the conduction resistance of FET 52 increases, and $V_{INT}$ decreases. In this way, control is made so that $V_{INT}$ matches $V_{REF}$.

Figure 12:
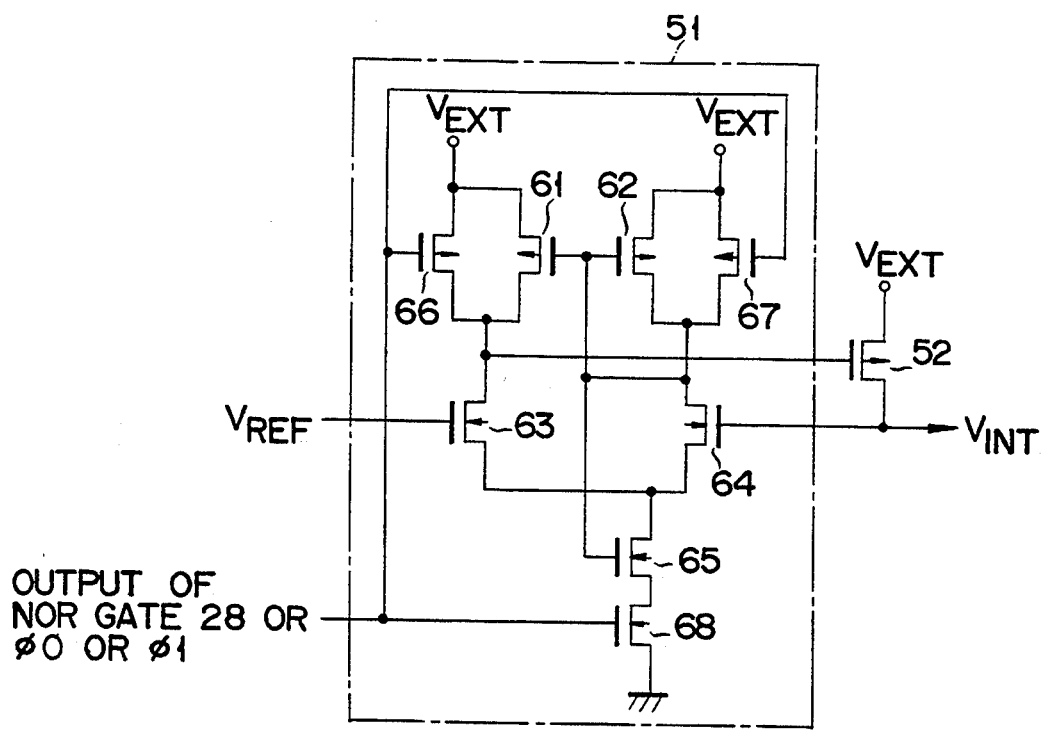
FIG. 12 is a circuit diagram showing the more detailed construction of FIG. 11.

FIG. 12 shows in more detail the voltage comparator 51 of the internal stepdown circuit in FIG. 11. As shown, the voltage comparator 51 is additionally provided with P-channel MOSFET's 66 and 67 and an N-channel MOSFET 68 fed with the output of the NOR gate 28 and the control signal $\phi 0$ or $\phi 1$. These FET's are added to the voltage comparator of the ordinary CMOS construction consisting of P-channel MOSFET's 61 and 62 and N-channel MOSFET's 63, 64 and 65, thereby for preventing a d.c. current from occuring during the standby operation or the battery backup operation. Incidentally, the element sizes of the FET's corresponding to each other are made to be different so as to make the current consumptions of the first and second internal stepdown circuits 21 and 22 differ from each other.

Figure 13:
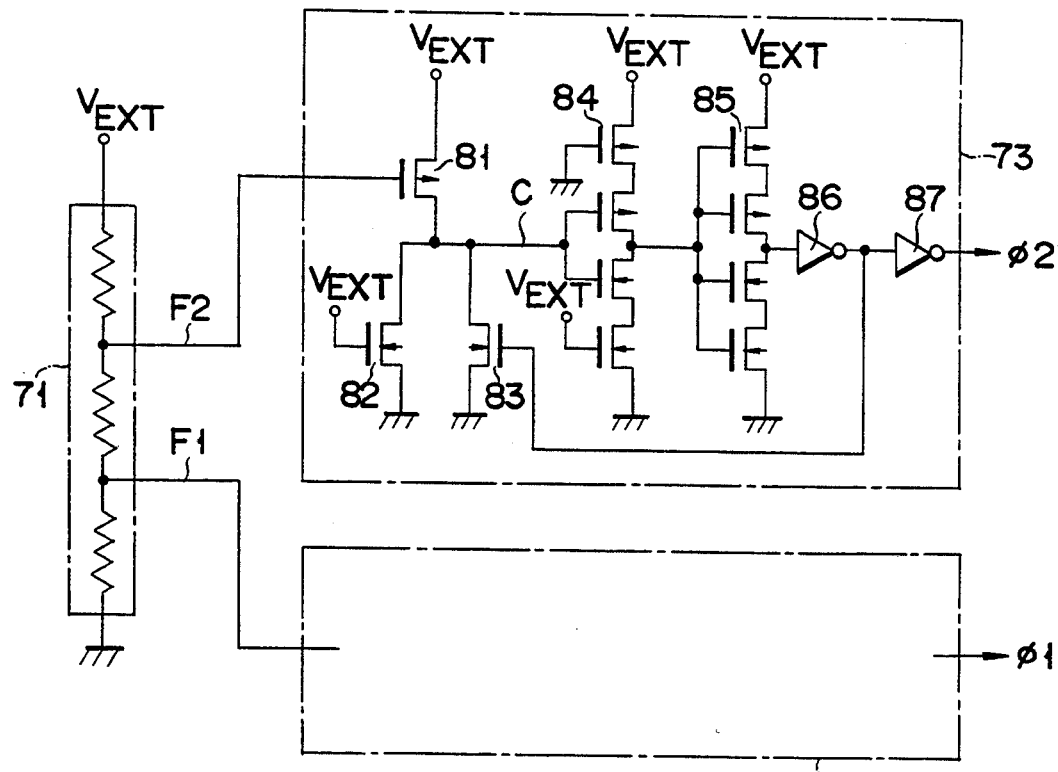
FIG. 13 is a circuit diagram showing the detailed construction of the external voltage detecting circuit in the embodiment circuit of FIG. 4.

FIG. 13 is a detailed circuit diagram of external voltage detecting circuit 16 in FIG. 8. This circuit consists of reference voltage generator circuit 71 in which the external power supply voltage $V_{EXT}$ is divided by three serially connected resistors to generate two reference voltages having different values at nodes F1 and F2, a first control signal generator circuit 72 which is supplied with the voltage of the one node F1 and compares the voltage of this node with the external power supply voltage $V_{EXT}$ to generate a control signal $\phi 1$ having the aforementioned hysteresis characteristics, and a second control signal generator circuit 73 which is supplied with the voltage of the other node F2 and compares the voltage of this node with the external power supply voltage $V_{EXT}$ to generate a control signal $\phi 2$ having the aforementioned hysteresis characteristics.

The first and second control signal generator circuits 72 and 73 are similarly constructed, and as illustrated in one circuit 73, they are provided with a P-channel MOSFET 81 inserted between the voltage $V_{EXT}$ and node C and having the voltage of node F2 (or F1) supplied to the gate thereof, an N-channel MOSFET 82 inserted between the node C and the ground voltage and having the voltage $V_{EXT}$ supplied to the gate thereof, an N-channel MOSFET 83 inserted between the node C and the ground voltage, a CMOS type inverter 84 for inverting the signal of the node C, a CMOS type inverter 85 for inverting the output of the inverter 84, an inverter 86 for inverting the output of the inverter 85, and an inverter 87 for inverting the output of the inverter 86 to output the control signal $\phi 2$ (or $\phi 1$). And, the output of inverter 86 is fed back to the gate of the FET 83.

In the circuit as mentioned above, when the external power supply voltage $V_{EXT}$ is 5 V, each P-channel MOSFET 81 in the two control signal generator circuits 72 and 73 is in an ON state, the control signals $\phi 1$ and $\phi 2$ are both at the "H" level. Then, when the external power supply voltage $V_{EXT}$ decreases to about 3 V and the potential difference between the voltage $V_{EXT}$ and the voltage of node F2 becomes smaller than the threshold voltage of the FET 81, FET 81 in control signal generator circuit 73 turns off and the control signal $\phi 2$ becomes the "L" level. If the external power supply voltage $V_{EXT}$ further decreases and the potential difference between the voltage $V_{EXT}$ and the voltage of node F1 becomes smaller than the threshold voltage of the FET 81, FET 81 in control signal generator circuit 72 turns off and the control signal φ1 becomes the "L" level.

In addition, in the above two control signal generator circuits 72, 73, FET 83 for feedback is omitted if it is not needed to provide such hysteresis characteristics.

Figure 14:
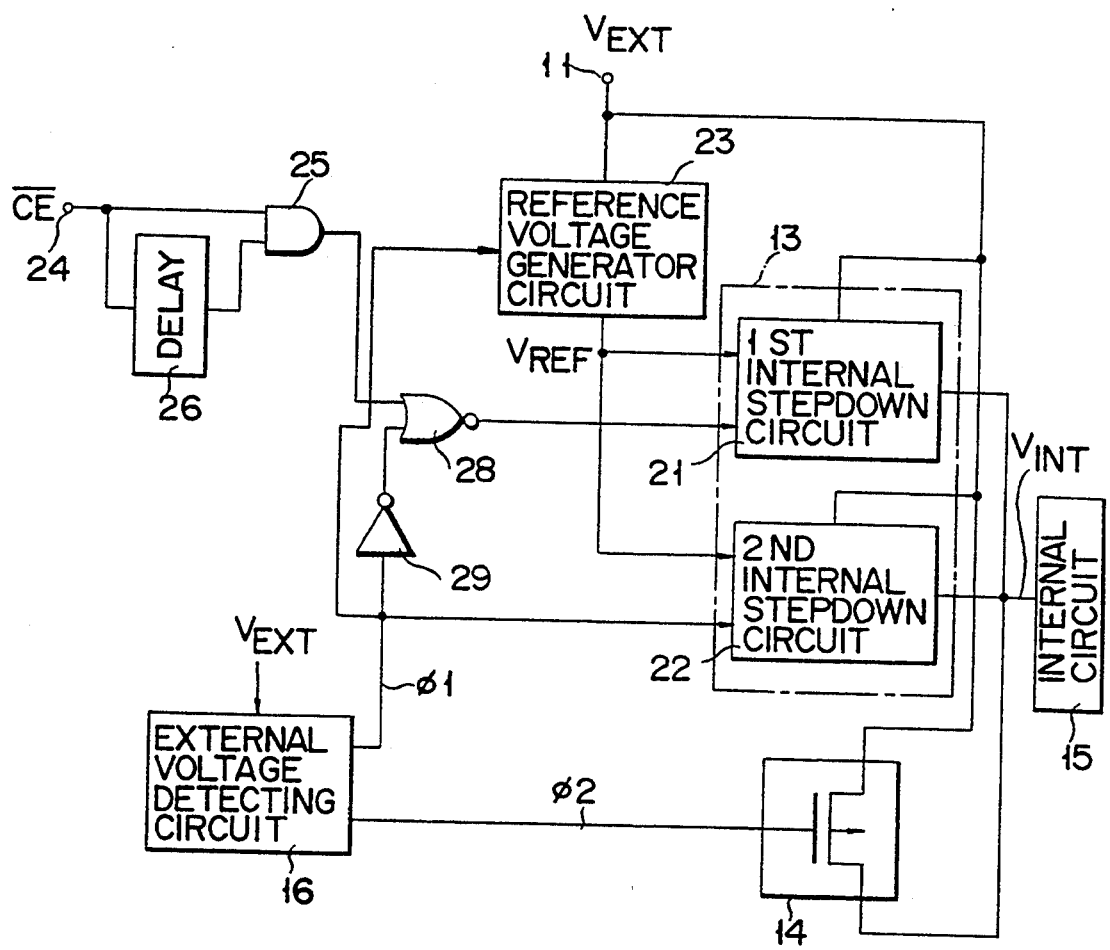
FIG. 14 is a block diagram showing the circuit construction of the fifth embodiment of this invention.

FIG. 14 shows the fifth embodiment of the present invention. This embodiment circuit is identical in construction to the circuit shown in FIG. 8, except that the operation of the reference voltage generator circuit 23 is controlled by control signal φ1 generated from the external voltage detecting circuit 16.

Figure 15:
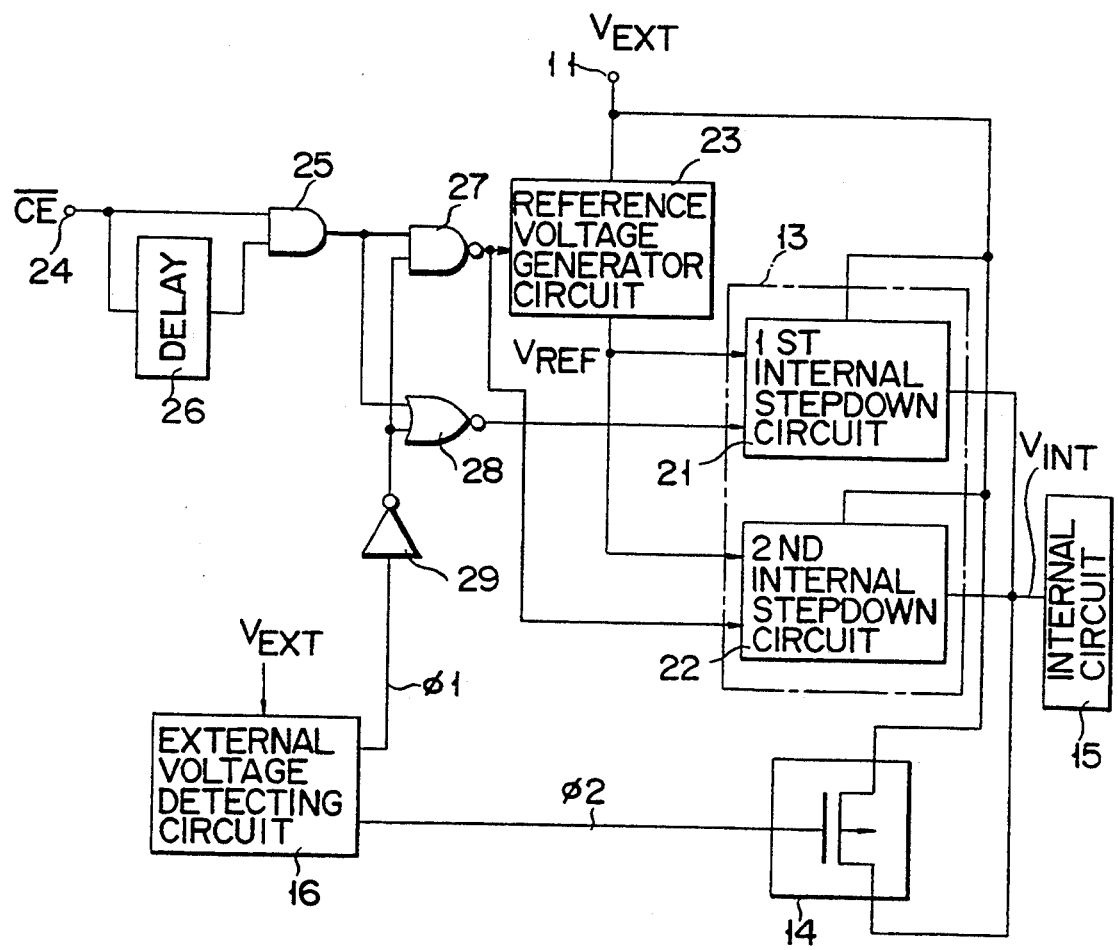
FIG. 15 is a block diagram showing the circuit construction of the sixth embodiment of this invention.

FIG. 15 shows the sixth embodiment of the present invention. This embodiment circuit is identical in construction to the circuit shown in FIG. 8, except that the operation of the second internal stepdown circuit 22 in the internal stepdown circuit 13 is controlled by the output from the NAND gate 27.

FIG. 16 shows the seventh embodiment of the present invention. This embodiment is similar in construction to the circuit shown in FIG. 8, except that two reference voltage generator circuit 101 and 102 are used instead of only one, and except that an AND gate 31 inverter 104 are used instead of the AND gate 25. The first reference voltage generator circuit 101, and the first internal stepdown circuit 121 for the regular operation, to which the reference voltage $V_{REF1}$ generated from the first reference voltage generator circuit 101 is supplied, are controlled by the output from and AND gate 103. This AND gate 103 receives the output from the AND gate 31 via the inverter 104, and the control signal φ1 generated from the external voltage detecting circuit 16. Further, the second reference voltage generator circuit 102, and the second internal stepdown circuit 22 for the standby operation, to which the reference voltage $V_{REF2}$ generated from the second reference voltage generator circuit 102 is supplied, are controlled by the control signal 01.

Figure 17:
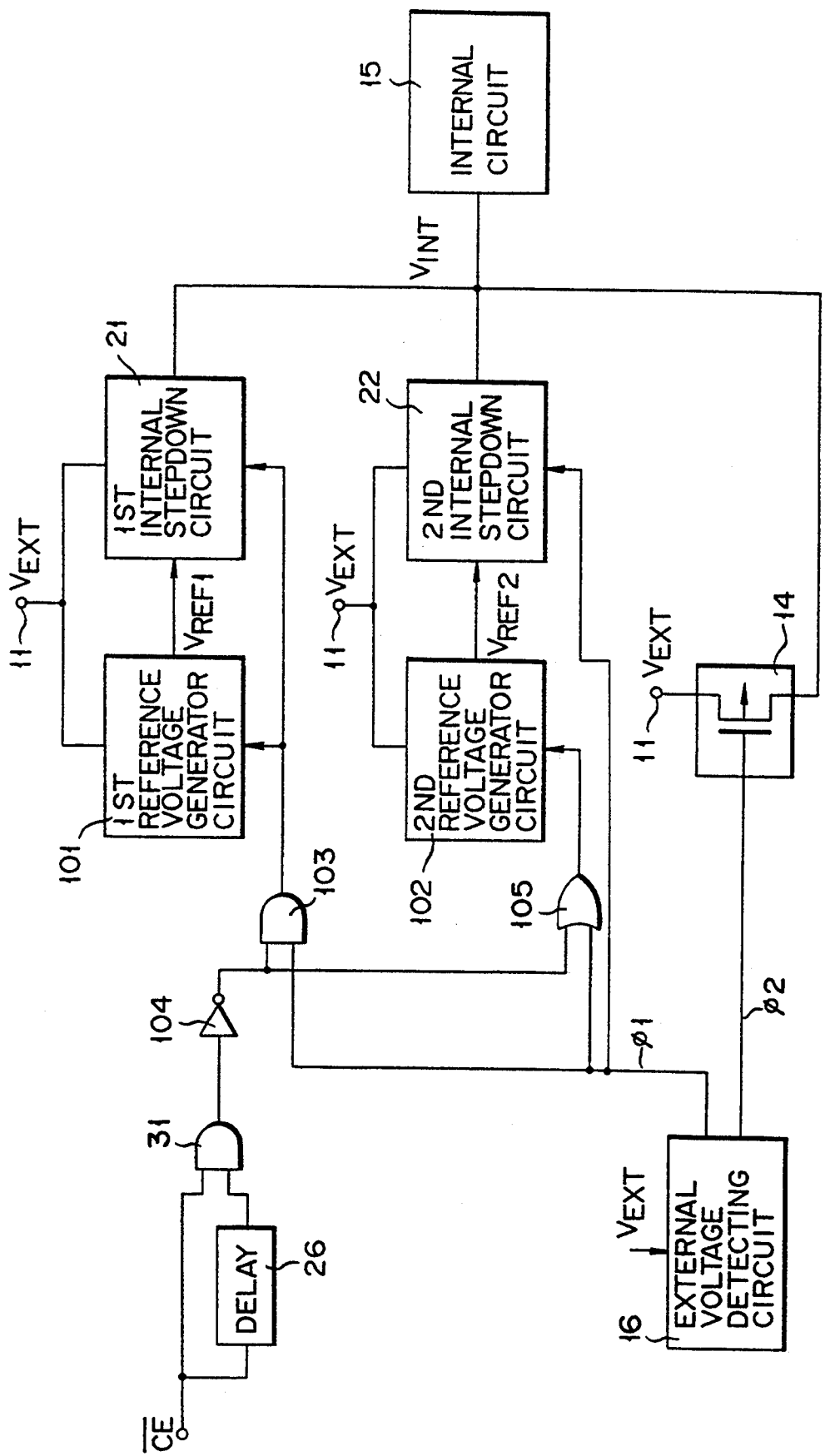
FIG. 17 is a block diagram showing the circuit construction of the eigth embodiment of this invention.

FIG. 17 shown the eight embodiment of the present invention. This eighth embodiment circuit is identical in construction to the seventh embodiment circuit shown in FIG. 16, except that the operation of the second reference voltage generator circuit 102 is controlled by the output from the OR gate 105 which receives the control signal φ1 and the output from the inverter 104.

FIG. 18 shows the ninth embodiment of the present invention. This ninth embodiment circuit is identical in construction to the seventh embodiment circuit, except that the operation of the second reference voltage generator circuit 102 is controlled by the output from the OR gate 105 as in the case of the eight embodiment shown in FIG. 17, and also that the operation of the internal stepdown circuit 22 for the standby operation, which receives the reference voltage $V_{REF2}$ generated from the second reference voltage generator circuit 102, is controlled by the output from the OR gate 105.

As described above, in accordance with this invention, a semiconductor integrated circuit can be provided wherein a long-term battery backup operation is available.

What is claimed is:

1. A semiconductor integrated circuit comprising:
    an internal circuit having a node;
    means for receiving a supply voltage;
    voltage detecting means for detecting a value of the supply voltage;
    voltage stepdown means for operating in one of
        an active mode for stepping down the supply voltage to apply a voltage to the node and
        an inactive mode, the voltage stepdown means operating in either the active mode or in the inactive mode in response to the voltage detecting means; and
    means, responsive to the voltage detecting means, for switching the receiving means to the node at times when the voltage stepdown means is operating in the inactive mode.

2. A semiconductor integrated circuit according to claim 1 wherein the means for switching includes a MOSFET.

3. A semiconductor integrated according to claim 1, wherein the voltage detecting means includes
    means for generating a control signal that is concurrently provided to the voltage stepdown means and the means for switching.

4. A semiconductor integrated according to claim 1, wherein the voltage detecting means includes
    means for generating a first control signal provided to the voltage stepdown means and a second control signal provided to the means for switching.

5. A semiconductor integrated according to claim 4, wherein the voltage detecting means includes
    means for generating the first control signal so that the voltage stepdown means operates in the active mode when the supply voltage value is larger than a first voltage value and operates in the inactive mode when the supply voltage value is smaller than the first voltage value, and for generating the second control signal so that the means for switching, switches the receiving means to the node when the supply voltage value is smaller than a second voltage value larger than the first voltage value.

6. A semiconductor integrated circuit, adapted for receiving a chip selection signal, comprising:
    an internal circuit having a node;
    means for receiving a supply voltage;
    voltage detecting means for detecting a value of the supply voltage to generate a control signal;
    first voltage stepdown means for operating in one of
        an active mode for stepping down the supply voltage to apply a voltage to the node, and
        an inactive mode, the first voltage stepdown means operating in either the active mode or in the inactive mode in response to the control signal and the chip selection signal;
    second voltage stepdown means for operating in one of
        an active mode for stepping down the supply voltage to apply a voltage to the node, and
        an inactive mode, the second voltage stepdown means operating in either the active mode or in the inactive mode in response to the control signal; and
    means, responsive to the voltage detecting means, for switching the receiving means to the node at times when the first and second voltage stepdown means are both operating in the inactive mode.

7. A semiconductor integrated circuit according to claim 6, wherein the means for switching includes a MOSFET.

8. A semiconductor integrated circuit according to claim 6, wherein the first and second voltage stepdown means have the same circuit construction, and the current supply capacity of the first voltage stepdown means is larger than that of the second voltage stepdown means.

9. A semiconductor integrated circuit, adapted for receiving a chip selection signal, comprising:
   an internal circuit having a node;
   means for receiving a power supply voltage;
   voltage detecting means for detecting a value of the supply voltage to generate a first control signal to indicate whether the value of the supply voltage is less than a first predetermined value and a second control signal to indicate whether the value of the supply voltage is less than a second predetermined value;
   first voltage stepdown means for operating in one of
      an active mode for stepping down the supply voltage to apply a voltage to the node, and
      an inactive mode, the first voltage stepdown means operating in either the active mode or in the inactive mode in response to the first control signal and the chip selection signal;
   second voltage stepdown means for operating in one of
      an active mode for stepping down the supply voltage to apply a voltage to the node, and
      an inactive mode, the second voltage stepdown means operating in either the active mode or in the inactive mode in response to the first control signal; and
   means, responsive to the second control signal, for switching the receiving means to the node in response to the second control signal.

10. A semiconductor integrated circuit according to claim 9, wherein the means for switching includes a MOSFET.

11. A semiconductor integrated circuit according to claim 9, wherein the first and second voltage stepdown means have the same circuit construction, and the current supply capacity of the first voltage stepdown means is larger than that of the second voltage stepdown means.

12. A semiconductor integrated circuit according to claim 9, further comprising means for generating two voltages whose values are different from each other, and wherein the voltage detecting means includes
   first and second control signal generator circuits which compare the supply voltage value with the respective ones of the two voltages to generate the first and second control signals.

* * * * *

UNITED STATES PATENT AND TRADEMARK OFFICE
CERTIFICATE OF CORRECTION

PATENT NO. : 5,347,170
DATED : September 13, 1994
INVENTOR(S) : Shigeyuki Hayakawa et al.

It is certified that error appears in the above-indentified patent and that said Letters Patent is hereby corrected as shown below:

In The Title Page, column 1, under Foreign Application Priority Data, change "Feb. 28, 1990" to --Feb. 8, 1990--.

In claim 3, column 10, line 12; claim 4, column 10, line, 18; and claim 5, column 10, line 23, after "integrated", insert --circuit--.

Signed and Sealed this

Twenty-first Day of March, 1995

Attest:

BRUCE LEHMAN

*Attesting Officer*     *Commissioner of Patents and Trademarks*